(12) United States Patent
Namai et al.

(10) Patent No.: US 8,085,035 B2
(45) Date of Patent: Dec. 27, 2011

(54) HALL ELEMENT AND MAGNETIC SENSOR

(75) Inventors: Takayuki Namai, Tokyo (JP); Katsumi Kakuta, Tokyo (JP)

(73) Assignee: Asahi Kasei EMD Corporation, Tokyo (JP)

( * ) Notice: Subject to any disclaimer, the term of this patent is extended or adjusted under 35 U.S.C. 154(b) by 468 days.

(21) Appl. No.: 12/225,371

(22) PCT Filed: Mar. 30, 2007

(86) PCT No.: PCT/JP2007/057099
§ 371 (c)(1),
(2), (4) Date: Sep. 19, 2008

(87) PCT Pub. No.: WO2007/116823
PCT Pub. Date: Oct. 18, 2007

(65) Prior Publication Data
US 2010/0164483 A1 Jul. 1, 2010

(30) Foreign Application Priority Data

Apr. 3, 2006 (JP) .................................. 2006-102314

(51) Int. Cl.
*H01L 43/06* (2006.01)
*G01R 33/06* (2006.01)
(52) U.S. Cl. ..................................... 324/207.2; 324/251
(58) Field of Classification Search .................... None
See application file for complete search history.

(56) References Cited

U.S. PATENT DOCUMENTS

| 4,578,692 A | 3/1986 | Higgs et al. |
| 4,660,065 A * | 4/1987 | Carvajal et al. ............... 257/426 |
| 2005/0230769 A1* | 10/2005 | Lilian et al. .................... 257/421 |
| 2005/0230770 A1* | 10/2005 | Oohira .......................... 257/421 |
| 2006/0097715 A1* | 5/2006 | Oohira et al. ............... 324/207.2 |

FOREIGN PATENT DOCUMENTS

| JP | 60-234387 A | 11/1985 |
| JP | 10-270773 A | 10/1998 |
| JP | 2004/257995 A | 9/2004 |
| JP | 2005/333103 A | 12/2005 |

* cited by examiner

*Primary Examiner* — Minh N Tang
(74) *Attorney, Agent, or Firm* — Morgan, Lewis & Bockisu LLP

(57) ABSTRACT

A Hall element is provided which has a high sensitivity and contributes to an improvement in S/N ratio per current by using a low-concentration n-well within a suitable range. The Hall element includes a p-type semiconductor substrate layer of p-type silicon, and an n-type impurity region located in a surface of the p-type semiconductor substrate layer, the n-type impurity region functioning as a magnetic sensing part. A p-type impurity region is located in a surface of the n-type impurity region, and n-type regions are located laterally of the p-type impurity region. A p-type substrate region having a resistivity equal to that of the p-type semiconductor substrate layer is located to extend around the n-type impurity region. An impurity concentration N in the n-type impurity region functioning as the magnetic sensing part is preferably from $1\times10^{16}$ to $3\times10^{16}$ (atoms/cm$^3$) and a distribution depth of the impurity concentration is preferably from 3.0 μm to 5.0 μm.

6 Claims, 13 Drawing Sheets

[Figure 1]
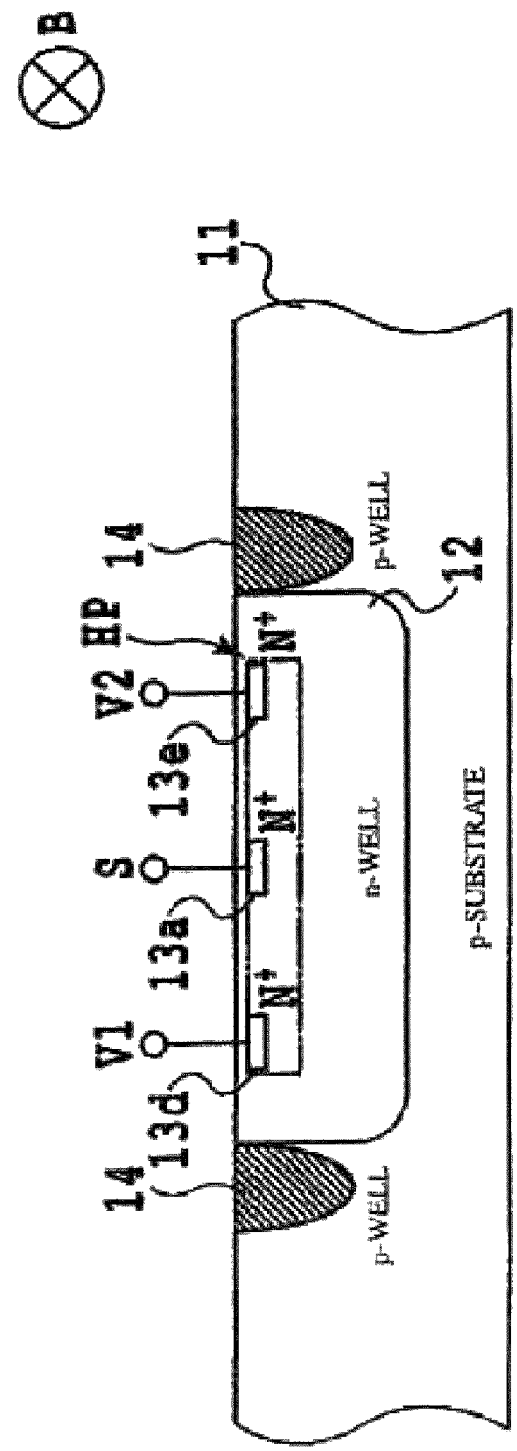
PRIOR ART

[Figure 2]
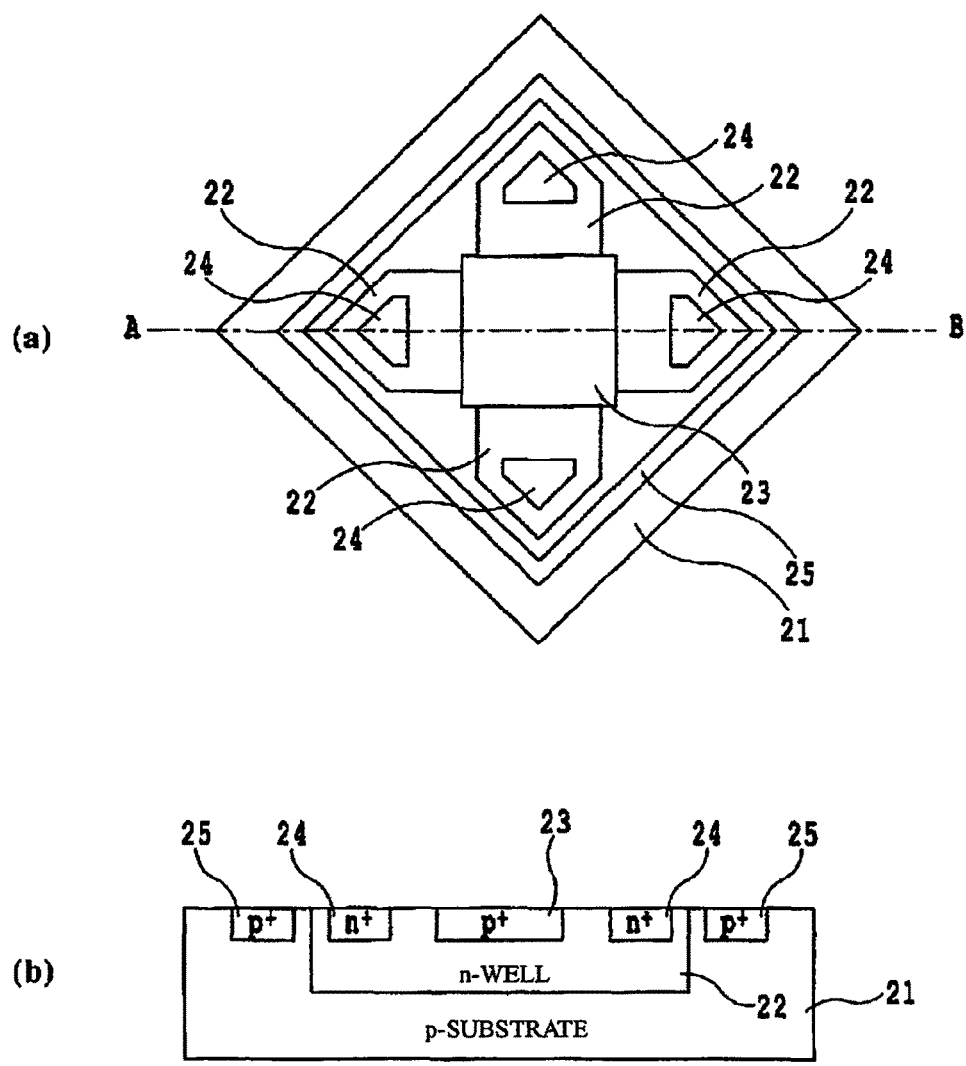

[Figure 3]
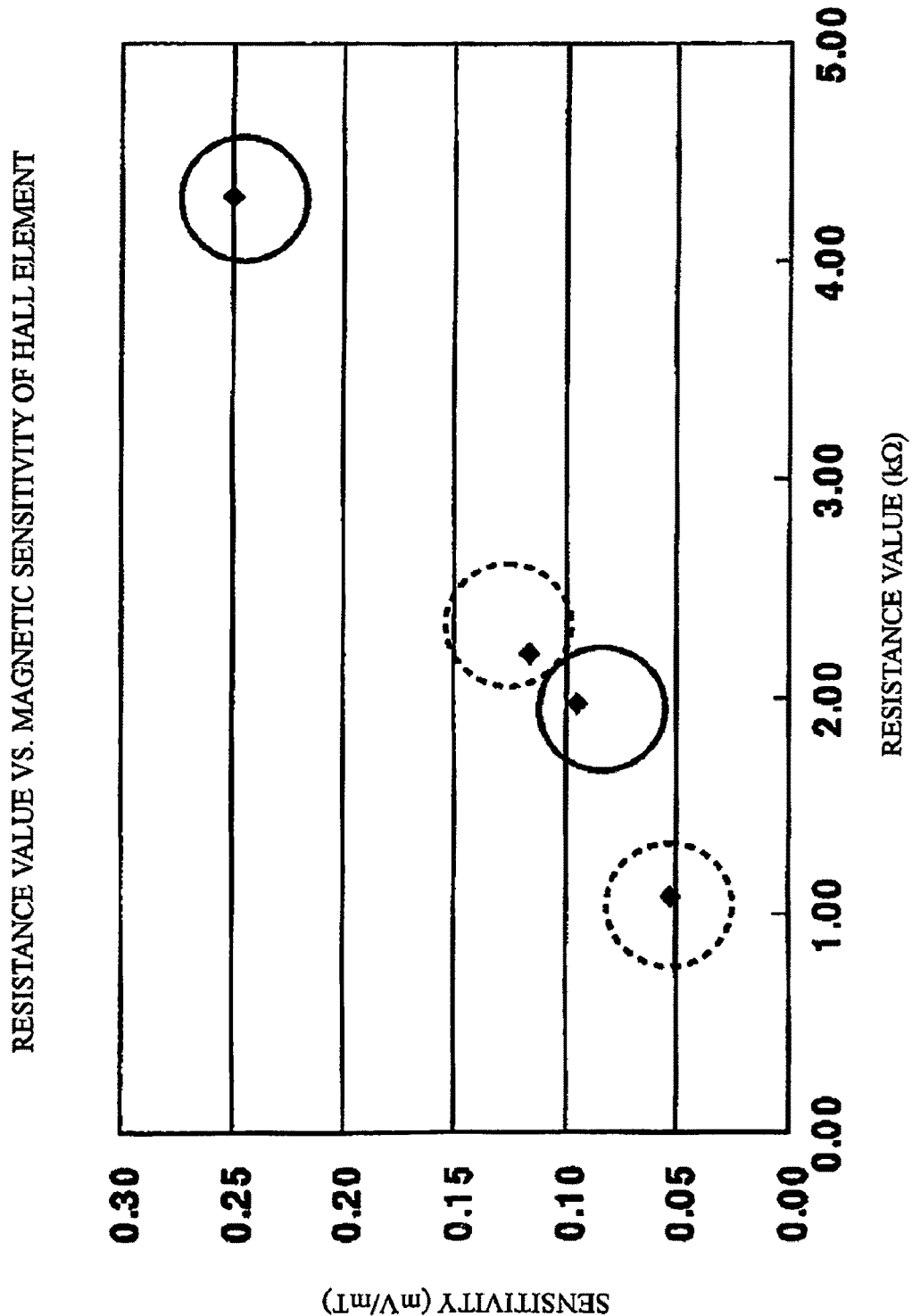

[Figure 4]
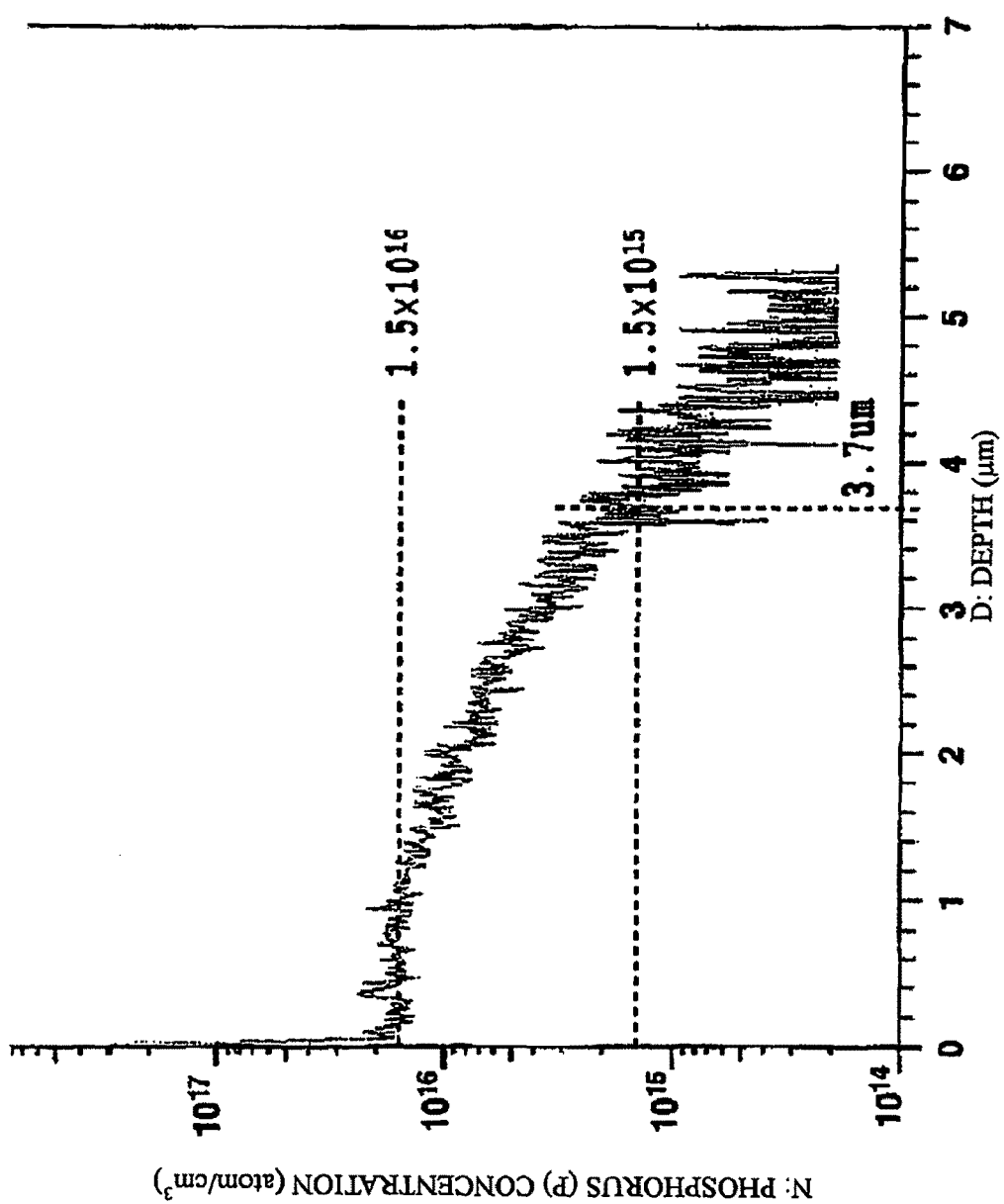

[Figure 5]
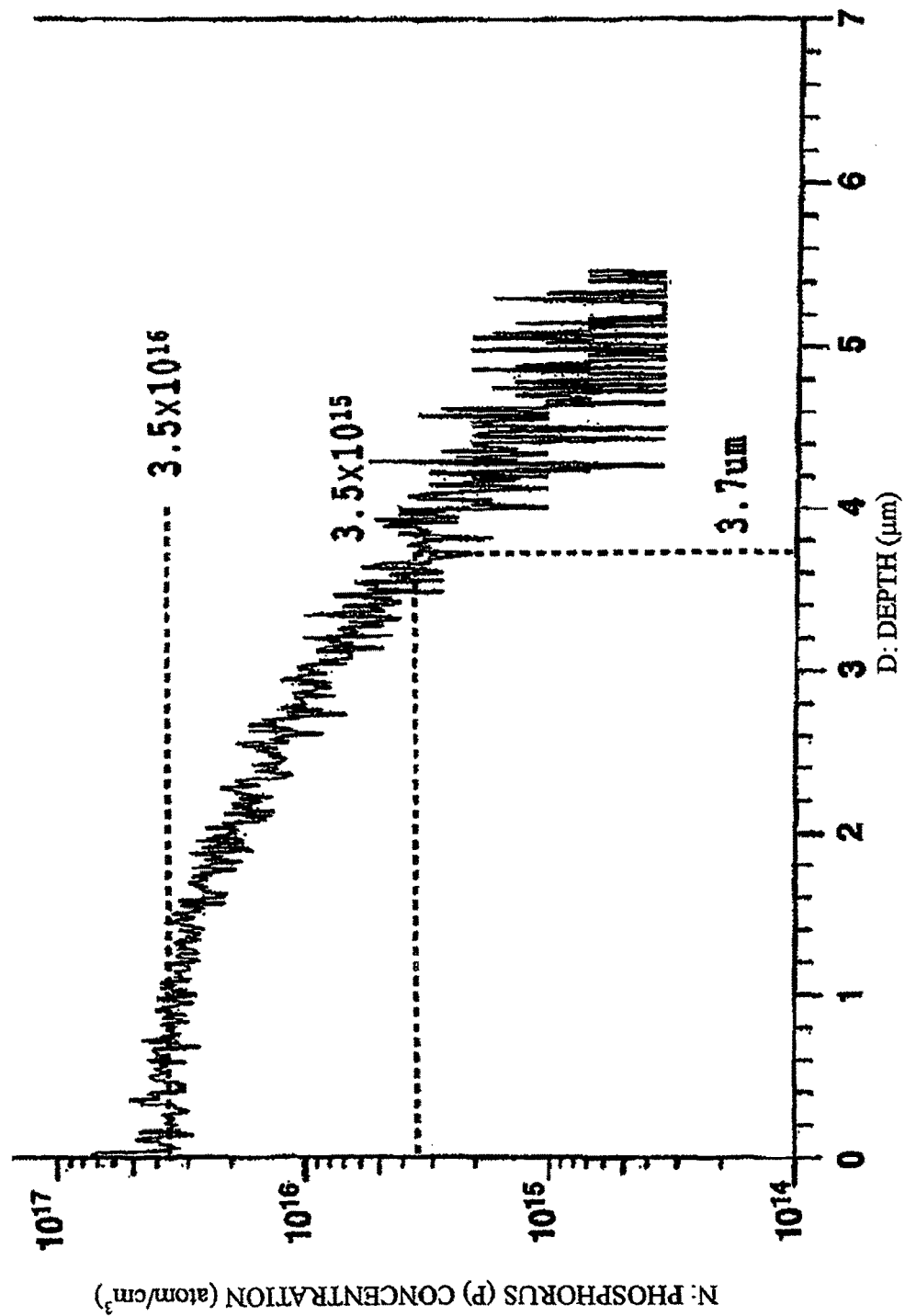

[Figure 6]
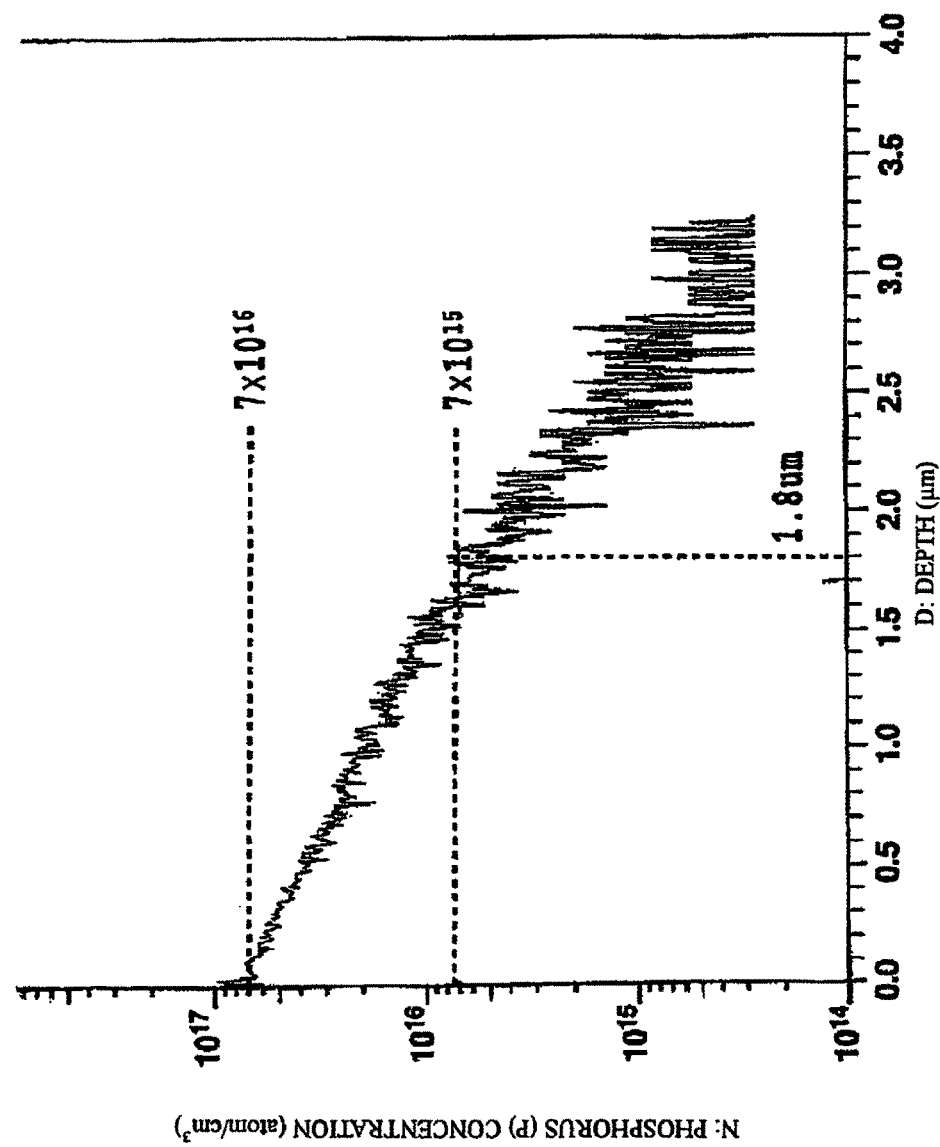

[Figure 7]
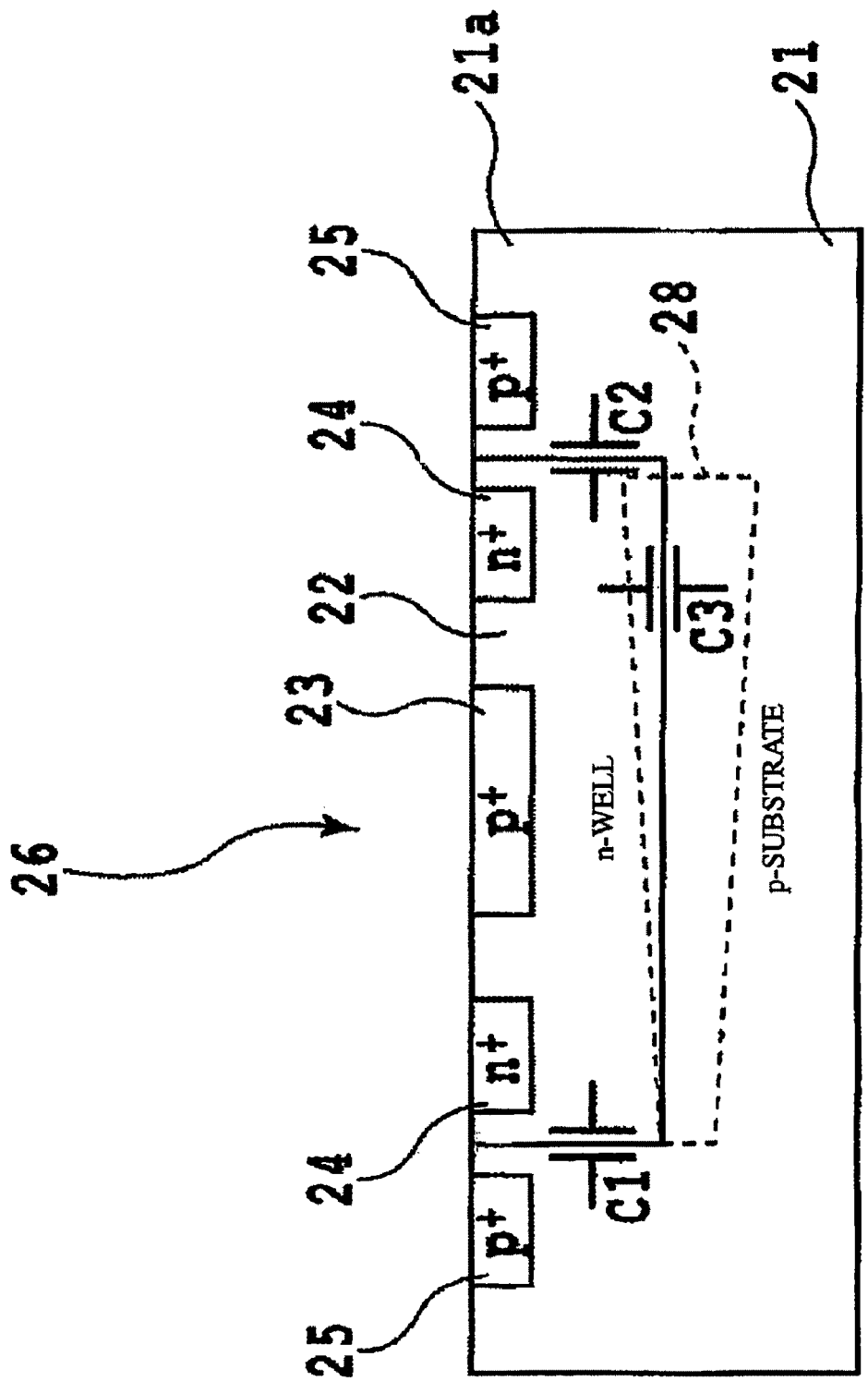

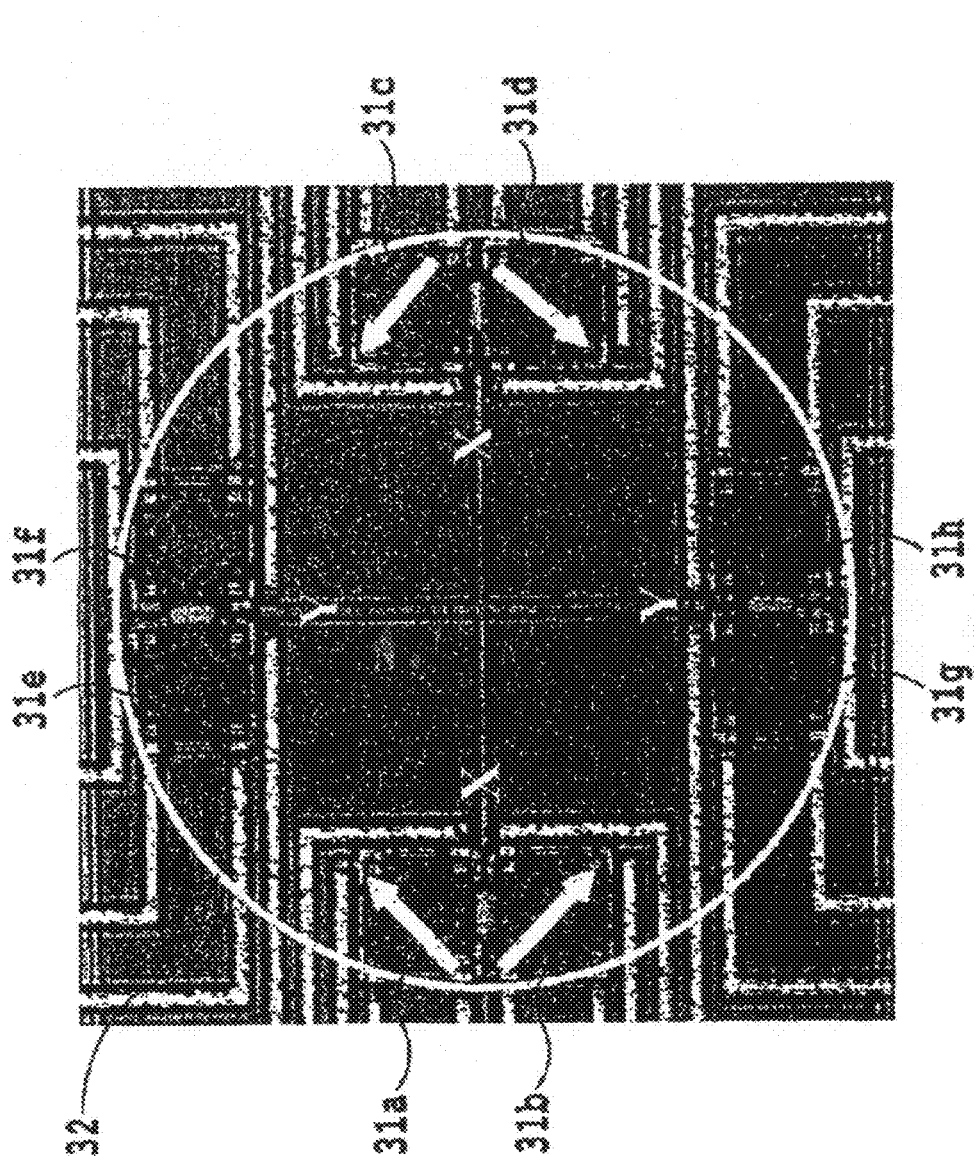
[Figure 8]

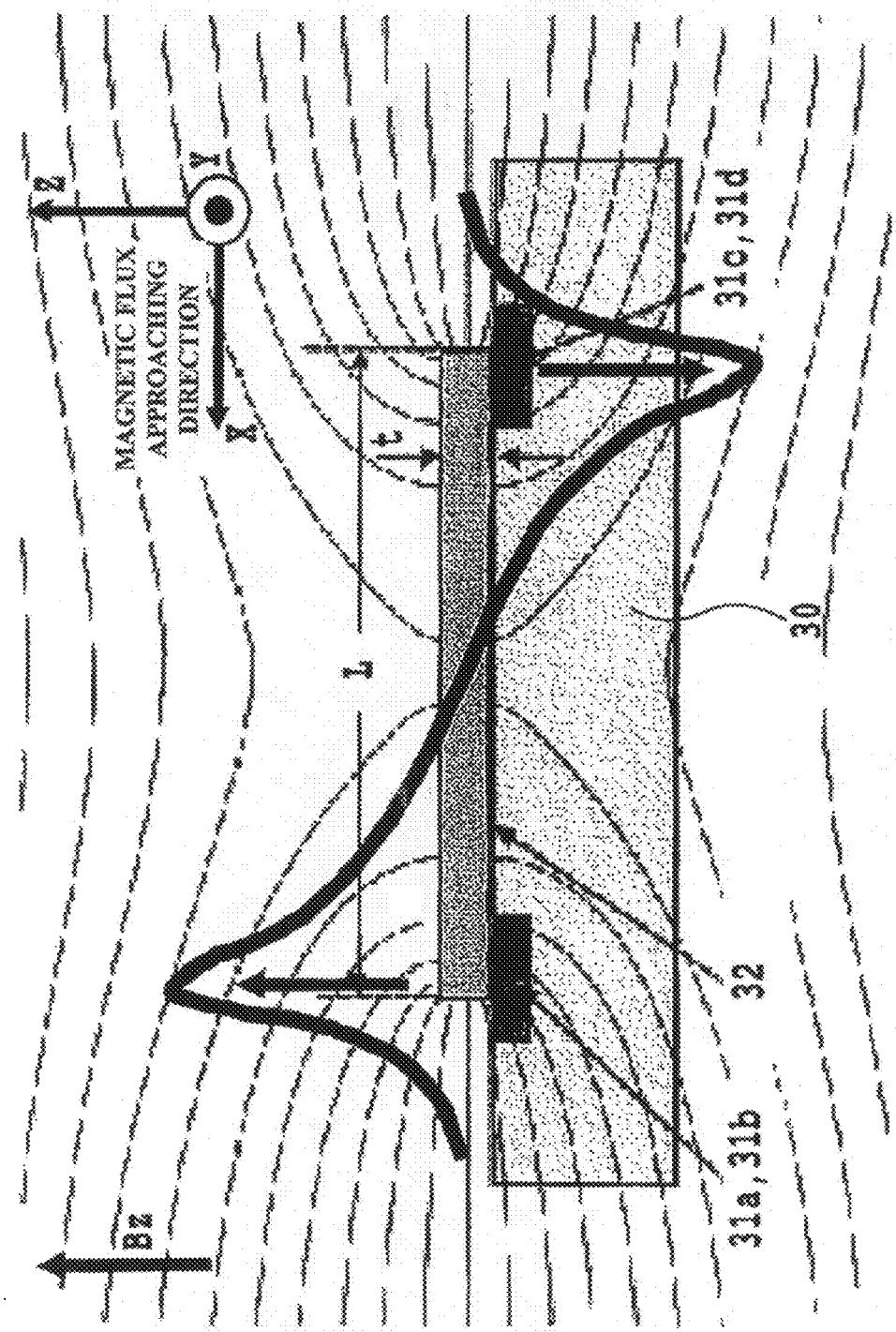
[Figure 9]

[Figure 10]
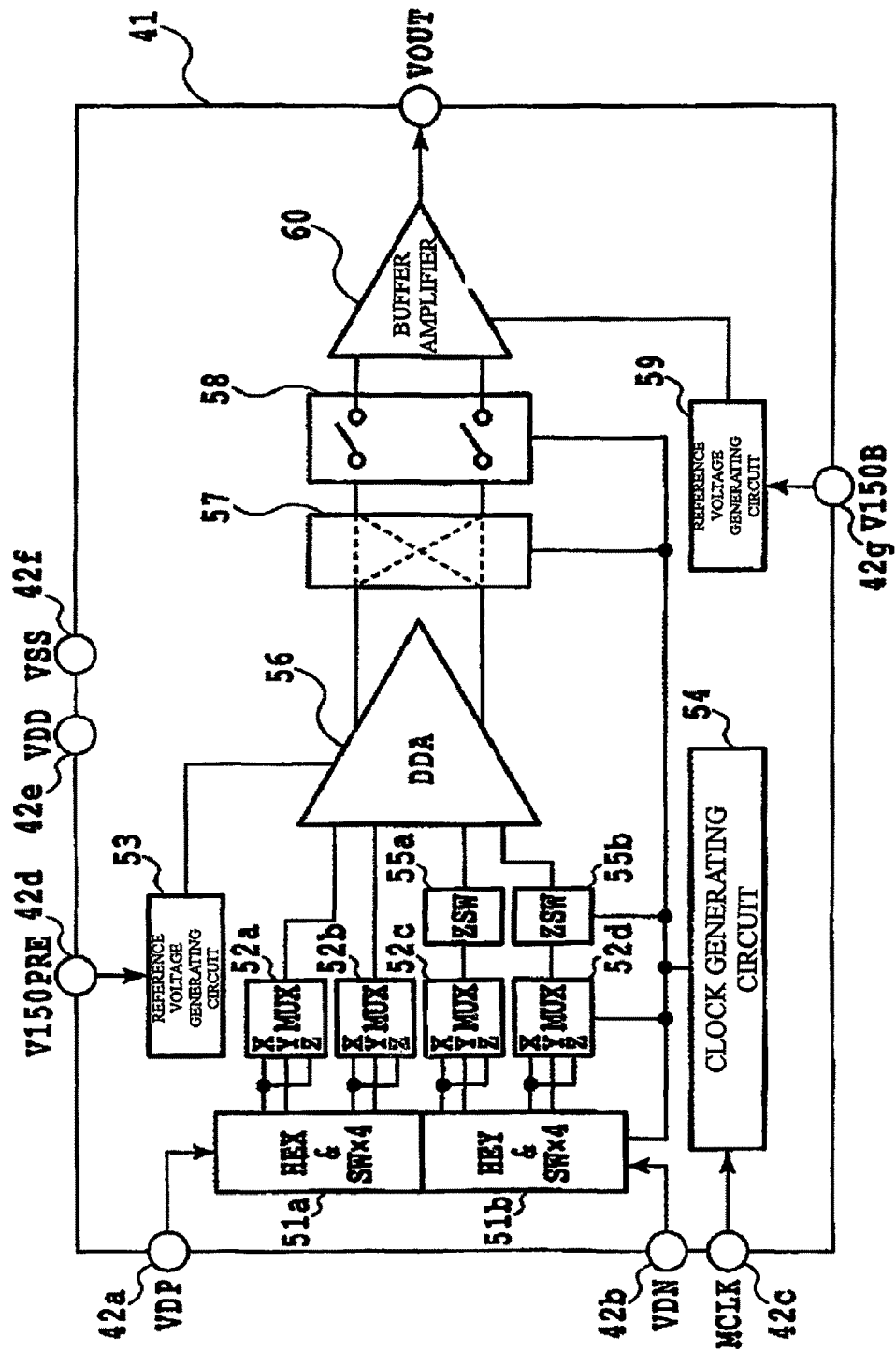

[Figure 11]
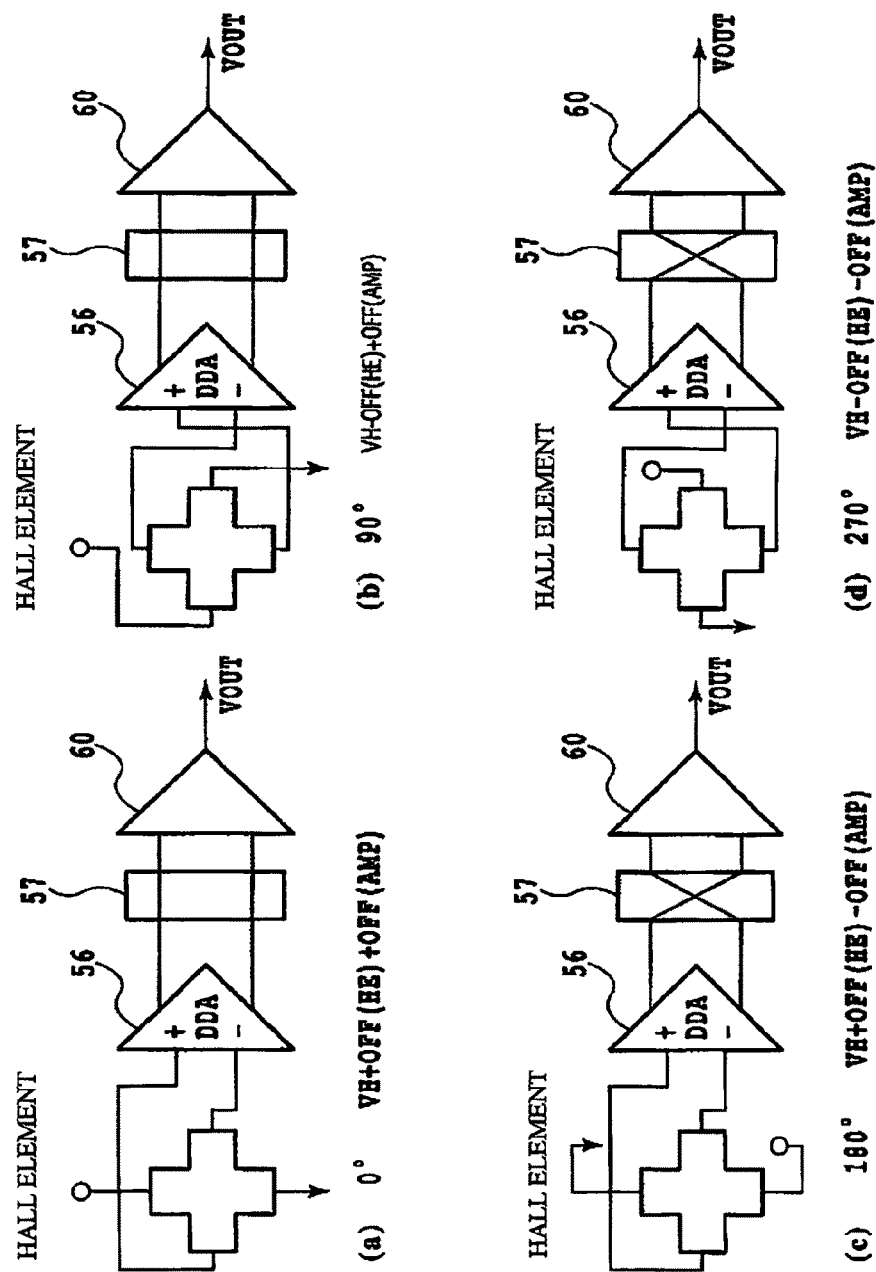

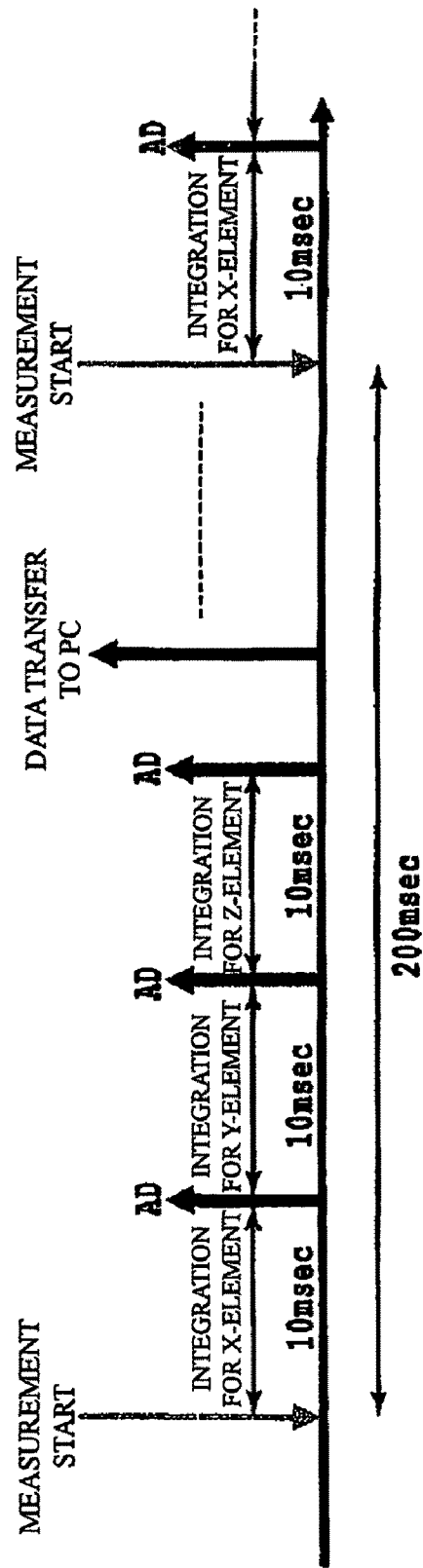
[Figure 12]

[Figure 13]
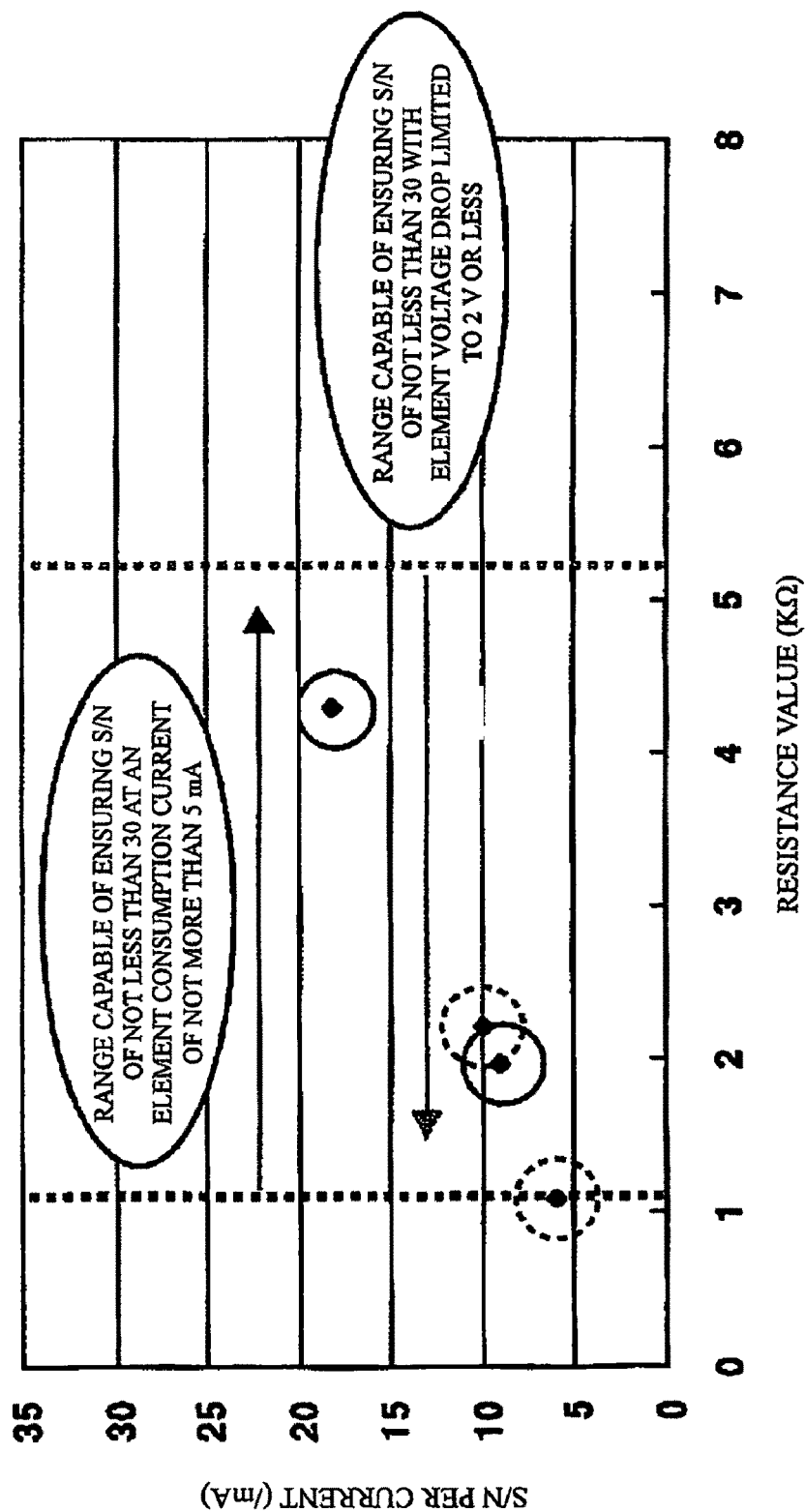

HALL ELEMENT AND MAGNETIC SENSOR

TECHNICAL FIELD

The present invention relates to a Hall element and a magnetic sensor and, more specifically, to a Hall element having an n-type impurity region located in a surface of a p-type semiconductor substrate layer composed of p-type silicon, the n-type impurity region functioning as a magnetic sensing part, as well as a magnetic sensor using the Hall element. Particularly, the Hall element and the magnetic sensor are for use in an azimuth sensor.

BACKGROUND ART

Conventionally, an azimuth sensor which detects the earth magnetism to determine an azimuth has employed a Hall element having a high sensitivity for detecting the weak earth magnetism. Hall elements of this type include a conventionally well-known Hall element adapted to detect a magnetic field component perpendicular to a substrate surface (i.e., chip face), and a vertical Hall device adapted to detect a magnetic field component horizontal to a substrate surface (i.e., chip face).

FIG. 1 is a schematic view for illustrating a conventional vertical Hall device. The Hall element, which is described in Patent Document 1, includes a semiconductor substrate layer 11 composed of p-type silicon, and an n-type semiconductor region (n-well) 12 formed as a diffusion layer (well) by doping a substrate surface with an n-type conductivity impurity. P-type diffusion layers (p-wells) 14 are located adjacent to the semiconductor region 12 for device isolation of the Hall element from other Hall elements. The p-type diffusion layers 14 are formed so as to be surrounded by the semiconductor substrate layer 11.

As the impurity concentration in the semiconductor region 12 becomes lower (i.e., thinner), the carrier mobility in this region becomes higher. For this reason, in order to increase the sensitivity of the Hall element as a magnetic sensing element, that is, in order to obtain a higher voltage as an output voltage, it is desirable that the impurity concentration in the semiconductor region 12 be lowered (i.e., thinned). Accordingly, the impurity concentration in the semiconductor region 12 is set to fall within a range of $1.0 \times 10^{14}/cm^3$ to $1.0 \times 10^{17}/cm^3$ for example.

Contact regions (n$^+$ diffusion layers) 13a, 13d and 13e are located in a region (active region) of the surface of the semiconductor region 12 which is surrounded by the diffusion layers 14 in order to increase the impurity concentration (n-type) in the surface selectively.

Patent Document 1: Japanese Patent Laid-Open No. 2005-333103

Any one of the azimuth sensors that have been developed so far comprises a magneto-resistance element, a flux gate, or the like which is based on a principle different from the Hall effect. For this reason, a signal processing chip and the azimuth sensor have been required to be placed in separate arrangements, thus making the construction complicated. Though it has been desired to develop an Si monolithic azimuth sensor, the insufficient S/N ratio due to a low sensitivity of an Si Hall element has precluded the practical use of such an Si monolithic azimuth sensor.

The conventional Hall element shown in FIG. 1, wherein the surface of the semiconductor substrate layer 11 is doped with the n-type conductivity impurity, which in turn is diffused to form the semiconductor region 12 as a diffusion layer (i.e., well), enables a substrate layer of a single conductivity type to be used as the semiconductor substrate layer of the Hall element and hence achieves the effect of enhancing the degree of freedom in selecting a substrate layer to be used in the formation of the Hall element.

However, problems have still remained until a low-concentration n-well is used within a suitable range as in the present invention to realize a Hall element which has a high sensitivity and contributes to an improvement in S/N ratio per current, and to realize a Hall element having a high breakdown voltage and high reliability. Further, the conventional Hall element has not been contrived to reduce the junction capacitance around a magnetic sensing part so that the element becomes less susceptible to noise caused by coupling.

The present invention has been made in view of such circumstances and, accordingly, an object of the present invention is to provide a Hall element and a magnetic sensor which have a high sensitivity and contribute to an improvement in S/N ratio per current by limiting a low-concentration n-well within a suitable range.

DISCLOSURE OF THE INVENTION

The present invention has been made to accomplish the foregoing object. An invention according to claim 1 is directed to a Hall element including an n-type impurity region (22) located in a surface of a p-type semiconductor substrate layer (21), said n-type impurity region functioning as a magnetic sensing part (26), characterized in that a p-type impurity region (23) is located in a surface of said n-type impurity region (22), and said n-type impurity region (22) is surrounded by a p-type substrate region (21a) of said p-type semiconductor substrate layer (21).

An invention according to claim 2 is directed to the Hall element according to the invention of claim 1, characterized in that an impurity concentration N in said n-type impurity region (22) is $1 \times 10^{16}$ (atoms/cm$^3$)$\leq N \leq 3 \times 10^{16}$(atoms/cm$^3$), and a distribution depth D of said impurity concentration is 3.0 μm$\leq$D$\leq$5.0 μm.

An invention according to claim 3 is directed to the Hall element according to the invention of claim 1 or 2, characterized in that said p-type substrate region (21a) has a resistivity equal to that of said p-type semiconductor substrate layer (21).

An invention according to claim 4 is directed to a magnetic sensor characterized in that a plurality of Hall elements according to any one of claims 1 to 3 are provided on a semiconductor substrate; and a magnetic substance having a function of magnetic concentration is provided on said Hall elements.

An invention according to claim 5 is directed to an azimuth measuring device characterized in that the magnetic sensor according to claim 4 is used therein.

According to the present invention, the p-type impurity region is located in a surface of the n-type impurity region, while the n-type impurity region is surrounded by the p-type substrate region of the p-type semiconductor substrate layer. By so limiting the low-concentration n-well within a suitable range, the present invention achieves the effect of realizing a Hall element which has a high sensitivity and contributes to an improvement in S/N ratio per current, as well as a Hall element having a high breakdown voltage and high reliability.

Also, since the magnetic sensing part is formed so as to be surrounded by the p-type substrate region, the present invention achieves not only the effect of realizing the Hall element having a high breakdown voltage and high reliability but also the effect of becoming less susceptible to noise caused by coupling by virtue of a reduction in the junction capacitance around the magnetic sensing part.

BRIEF DESCRIPTION OF THE DRAWINGS

FIG. 1 is a schematic view for illustrating a conventional vertical Hall device;

FIG. 2 includes schematic views for illustrating Example 1 of a Hall element according to the present invention; FIG. 2(a) is a top plan view and FIG. 2(b) is a sectional view taken on line A-B of FIG. 2(a);

FIG. 3 is a chart showing a relationship between a resistance value and a magnetic sensitivity of the Hall element according to the present invention;

FIG. 4 is a chart showing a graph for illustrating a distribution depth of an impurity concentration in an n-type impurity region of the Hall element according to the present invention;

FIG. 5 is a chart (first chart) showing a graph for illustrating a distribution depth of an impurity concentration in a conventional Hall element for comparison with the distribution depth of an impurity concentration in the n-type impurity region of the Hall element according to the present invention;

FIG. 6 is a chart (second chart) showing a graph for illustrating a distribution depth of an impurity concentration in a conventional Hall element for comparison with the distribution depth of an impurity concentration in the n-type impurity region of the Hall element according to the present invention;

FIG. 7 is a schematic view for illustrating Example 2 of a Hall element according to the present invention;

FIG. 8 is a view showing a magnetic sensor to which the Hall element according to the present invention is applied;

FIG. 9 is a view for illustrating the operating principle of the magnetic sensor core shown in FIG. 8;

FIG. 10 is a circuit block diagram of an azimuth measuring device using the azimuth sensor shown in FIG. 8;

FIGS. 11(a) to 11(d) are each a diagram for illustrating an offset cancellation method used for the circuit of the azimuth measuring device shown in FIG. 10;

FIG. 12 is a chart showing one example of an S/N measurement sequence for illustrating an operation of the circuit shown in the circuit block diagram of FIG. 10; and FIG. 13 is a chart showing a resistance value of a practical Hall element as the azimuth sensor shown in FIG. 8.

DESCRIPTION OF SYMBOLS

| | |
|---|---|
| 11 | semiconductor substrate layer |
| 12 | n-type semiconductor region (n-well) |
| 13a, 13d, 13e | contact region (n$^+$ diffusion layer) |
| 14 | p-type diffusion layer (p-well) |
| 21 | p-type semiconductor substrate layer |
| 21a | p-type substrate region |
| 22 | n-type impurity region (n-well) |
| 23 | p-type impurity region (p$^+$ diffusion layer) |
| 24 | n-type region (n$^+$ diffusion layer) |
| 25 | p-type region (p$^+$ diffusion layer) |
| 26 | magnetic sensing part |
| 27 | electrode |
| 28 | depletion layer |
| C1, C2, C3 | junction capacitance |
| 31a to 31h | Hall element (cross-shaped) |
| 32 | magnetic substance |
| 33 | interconnection pattern |
| 41 | circuit unit |
| 42a to 42h | terminal |
| 51a | X-direction Hall elements (four elements) and their respective driving switches |
| 51b | Y-direction Hall elements (four elements) and their respective driving switches |
| 52a, 52b, 52c, 52d | channel selecting multiplexer |
| 53 | reference voltage generating circuit for a preamplifier |
| 54 | clock |
| 55a, 55b | polarity reversing switch for Z-direction detection |
| 56 | preamplifier (DDA) |
| 57 | chopper switch |
| 58 | monitor switch |
| 59 | reference voltage generating circuit for a buffer amplifier |
| 60 | buffer amplifier |

BEST MODE FOR CARRYING OUT THE INVENTION

Hereinafter, examples of the present invention will be described with reference to the drawings.

EXAMPLE 1

FIGS. 2(a) and 2(b) are each a schematic view for illustrating Example 1 of a Hall element according to the present invention; FIG. 2(a) is a top plan view and FIG. 2(b) is a sectional view taken on line A-B of FIG. 2(a). Reference numeral 21 designates a p-type semiconductor substrate layer, 21a designates a p-type substrate region, 22 designates an n-type impurity region (n-well), 23 designates a p-type impurity region (p$^+$ diffusion layer), 24 designates an n-type region (n$^+$ diffusion layer), 25 designates a p-type region (p$^+$ diffusion layer), 26 designates a magnetic sensing part, and 27 designates an electrode.

The Hall element of the present invention includes the p-type semiconductor substrate layer 21 composed of p-type silicon, and the n-type impurity region 22 located in a surface of the p-type semiconductor substrate layer 21. The n-type impurity region 22 functions as the magnetic sensing part 26.

The p-type impurity region 23 is located in a surface of the n-type impurity region 22, and n-type regions 24 are located laterally of the p-type impurity region 23. The p-type substrate region 21a having a resistivity equal to that of the p-type semiconductor substrate layer 21 is located to extend around the n-type impurity region 22.

The arrangement in which the magnetic sensing part is surrounded by the p-type substrate region 21a has two advantages. One of the advantages is that since the magnetic sensing part is surrounded by the p-type substrate region 21a having a lower impurity concentration than the p-well, a horizontal expanse of a depletion layer is enlarged, which allows the breakdown voltage across the p-type substrate region 21a and the n-well region 22 to be improved. Thus, it is possible to realize a Hall element having a high breakdown voltage and high reliability. The other advantage is that the junction capacitance around the magnetic sensing part is reduced, which brings a benefit that the magnetic sensing part becomes less susceptible to noise caused by coupling from around the magnetic sensing part through the capacitance. P-type regions (p$^+$ diffusion layers) 25 are located in a surface of the p-type substrate region 21a to determine a substrate potential.

An impurity concentration N in the n-type impurity region 22 functioning as the magnetic sensing part 26 is preferably $1 \times 10^{16}$ (atoms/cm$^3$)$\leq$N$\leq$$3 \times 10^{16}$ (atoms/cm$^3$), and a distribution depth D of the impurity concentration is preferably 3.0

$\mu m \leq D \leq 5.0$ $\mu m$. In contrast to the impurity concentration of $1.0 \times 10^{14}/cm^3$ to $1.0 \times 10^{17}/cm^3$ in the semiconductor region 12 of the Hall element described in the aforementioned Patent Document 1, the impurity concentration N in the n-type impurity region 22 is $1 \times 10^{16}$ (atoms/cm$^3$)$\leq N \leq 3 \times 10^{16}$ (atoms/cm$^3$) according to the present invention. For this reason, it is possible to realize the Hall element having a limited suitable range of the impurity concentration in the n-well which is lower than that in the conventional one.

The grounds therefor will be described with reference to FIG. 3.

FIG. 3 is a chart showing a relationship between a resistance value and a magnetic sensitivity of the Hall element according to the present invention as a graph for illustrating the effect of a low-concentration n-well on an increase in sensitivity. In FIG. 3, a solid line circular mark and a broken line circular mark represent a cross-shaped Hall element and a square-shaped Hall element, respectively; and the upper right-hand circular mark represents the Hall element of the present invention, while the lower left-hand circular mark represents a normal Hall element. The Hall elements are each driven at a constant current, and the magnetic sensitivity of each of the Hall elements is represented as an output voltage per unit current per unit magnetic field. For easier understanding, numeric values are shown in Table 1. Table 1 collectively shows resistance values and magnetic sensitivities of Hall elements according to the present invention.

TABLE 1

List of Hall element characteristics

|  | Resistance value (kΩ) | Magnetic sensitivity (mV/mT/mA) |
|---|---|---|
| Cross-shaped Hall element (low-concentration n-well) | 4.3 | 0.250 |
| Cross-shaped Hall element (normal n-well) | 2.0 | 0.095 |
| Square-shaped Hall element (low-concentration n-well) | 2.2 | 0.113 |
| Square-shaped Hall element (normal n-well) | 1.1 | 0.053 |

|  | Resistance ratio (times) | Magnetic sensitivity ratio (times) |
|---|---|---|
| Comparison between cross-shaped Hall elements (based on normal n-well Hall element taking on a value of 1) | | |
| Cross-shaped Hall element (low-concentration n-well) | 2.15 | 2.632 |
| Cross-shaped Hall element (normal n-well) | 1.00 | 1.000 |
| Comparison between square-shaped Hall elements (based on normal n-well Hall element taking on a value of 1) | | |
| Square-shaped Hall element (low-concentration n-well) | 2.00 | 2.132 |
| Square-shaped Hall element (normal n-well) | 1.00 | 1.000 |

According to FIG. 3 and Table 1, the cross-shaped normal Hall element exhibits a resistance value of about 2.0 kΩ and a sensitivity of about 0.095 (mV/mT), whereas the cross-shaped Hall element according to the present invention exhibits a resistance value of about 4.30 kΩ and a sensitivity of about 0.25 (mV/mT). According to the Hall element theory, the magnetic sensitivity of a Hall element driven at a constant current is proportional to the resistance value of the Hall element. When the two Hall elements are compared with each other, however, the resistance value increases 2.15 times, i.e., 4.30/2.0=2.15, while the magnetic sensitivity increases 2.63 times, i.e., 0.25/0.095=2.63. As can be seen therefrom, the increase in the sensitivity of the Hall element having the low-concentration n-well according to the present invention is larger than the theoretical value. With appropriate signal processing, flicker noise of the Hall element can be eliminated and thermal noise becomes predominant. It is theoretically known that the thermal noise is proportional to the one-second power of a resistance value.

When the two Hall elements are compared with each other, the thermal noise increases $\sqrt{(2.15)}$ times since the resistance value increases 2.15 times, while the sensitivity increases 2.63 times. It follows that the S/N ratio is improved 1.79 times, i.e., $2.63/\sqrt{(2.15)}=1.79$. As can be seen therefrom, though the S/N ratio is expected to improve 1.36 times, i.e., $2.0/\sqrt{(2.15)}=1.36$ according to the Hall element theory, the S/N ratio of the Hall element according to the present invention is more improved than the theory. Though there is a difference to some extent, the square-shaped Hall element achieves a similar effect.

The Hall element using the low-concentration n-well according to the present invention achieves such an effect remarkably. This can be well proven by comparison between the cross-shaped normal Hall element and the square-shaped normal Hall element. The resistance value of the cross-shaped normal Hall element is 1.8 times as large as that of the square-shaped normal Hall element, while the magnetic sensitivity of the cross-shaped normal Hall element is 1.79 times, i.e., 0.095/0.053=1.79, as high as that of the square-shaped normal Hall element. As can be seen therefrom, the magnetic sensitivity is substantially multiplied by the factor by which the resistance value is multiplied.

FIG. 4 is a chart showing a graph for illustrating a distribution depth of an impurity concentration in the n-type impurity region of the Hall element according to the present invention. FIG. 4 shows the result (phosphorus (P) concentration) of an SIMS (Secondary Ion Mass Spectrometry) analysis on the magnetic sensing part 26 of the Hall element. The depth D is defined by a point at which the impurity concentration goes down to one-tenth of the impurity concentration N, that is, a point between $1.5 \times 10^{15}$ and $1.5 \times 10^{16}$. In the present invention, the distribution depth D of the impurity concentration preferably falls within the range: $3.0$ $\mu m \leq D \leq 5.0$ $\mu m$.

FIGS. 5 and 6 are each a chart showing a graph for illustrating a distribution depth of an impurity concentration in a conventional Hall element for comparison with the distribution depth of the impurity concentration in the n-type impurity region of the Hall element according to the present invention. FIGS. 5 and 6 each show the result (phosphorus (P) concentration) of an SIMS analysis on the magnetic sensing part of the Hall element.

In FIG. 5, the depth D is defined by a point at which the impurity concentration goes down to one-tenth of the impurity concentration N, that is, a point between $3.5 \times 10^{15}$ and $3.5 \times 10^{16}$. In this case, the impurity concentration N takes on $3.5 \times 10^{15}$ when the depth is 3.7 $\mu m$. In FIG. 6, the depth D is defined by a point at which the impurity concentration goes down to one-tenth of the impurity concentration N, that is, a point between $7 \times 10^{15}$ and $7 \times 10^{16}$. In this case, the impurity concentration N takes on $7 \times 10^{15}$ when the depth is 1.8 $\mu m$.

In the present invention shown in FIG. 3, the impurity concentration N takes on $1.5 \times 10^{15}$ when the depth is 3.7 $\mu m$. As can be seen from comparison with FIGS. 5 and 6, the magnetic sensing part according to the present invention is realized at a lower concentration. This concentration region remarkably achieves the effect that the increase in magnetic sensitivity is larger than the increase in resistance value, as described above. Though a lower concentration is considered to achieve a greater effect, an increase in resistance value is brought about. From the viewpoint of a practical azimuth measuring device, there is a limitation on the resistance value. As will be described in later Example 2, we have found out that a suitable range of resistance value R is 1 k$\Omega \leq R \leq 5.3$ k$\Omega$. The resistance value of a Hall element is determined from the impurity concentration and the impurity distribution depth in the n-well. Even when the concentration is low, the resistance value can be lowered by increasing the depth. However, this case calls for a special process such as implantation with high energy.

With a view to realizing a Hall element which is practical as an azimuth measuring device while achieving a great effect of increasing the magnetic sensitivity without using such a special process, the present invention sets the impurity concentration within the range: $1 \times 10^{16}$ (atoms/cm$^3$)$\leq N \leq 3 \times 10^{16}$ (atoms/cm$^3$) and the distribution depth D of the impurity concentration within the range: 3.0 µm$\leq D \leq 5.0$ µm. As described above, an impurity concentration region of $3.5 \times 10^{15}$, which is the impurity concentration region of the normal n-well, fails to bring about the effect that the increase in magnetic sensitivity is larger than the increase in resistance value.

The S/N ratio can be improved by forming the p$^+$ diffusion layer 23 on the n-well 22. This is because the presence of the p$^+$ diffusion layer 23 allows a depletion layer to be formed at the interface with the n-well, so that carriers in the Hall element flow while keeping away from the interface which has a number of defects, thus resulting in an effect of suppressing generation of noise caused by scattering and recombination of the carriers.

EXAMPLE 2

FIG. 7 is a schematic sectional view taken on line A-B of FIG. 2(a) for illustrating Example 2 of a Hall element according to the present invention. In FIG. 7, reference numeral 28 designates a depletion layer, and reference characters C1, C2 and C3 designate junction capacitances. Other reference numerals are each the same as used in FIG. 2(b).

In Example 2, a wide region of the depletion layer 28 is provided at the interface between the n-type impurity region 22 and the p-type semiconductor substrate layer 21. That is, this arrangement allows a depletion layer width to increase at the interface between the low-concentration p-type semiconductor substrate layer 21 and the low-concentration n-well 22. For this reason, the junction capacitances C1, C2 and C3 are reduced, so that coupling noise from the p-type semiconductor layer 21 is reduced, thus resulting in an improved S/N ratio. Further, an improvement in breakdown voltage ensures high reliability and, hence, it is possible to boost the voltage applied to the Hall element by means of a charge pump or the like in order to improve the S/N ratio. Thus, coupling noise turning into the n-well from the p-type semiconductor substrate layer 21 is reduced by the reduction in junction capacitance, thus resulting in an increase in sensitivity.

FIG. 8 is a view showing a magnetic sensor to which the Hall element of the present invention is applied; specifically, FIG. 8 shows a core portion of an Si monolithic azimuth sensor. In FIG. 8, reference numerals 31a to 31h each designate a cross-shaped Hall element, 32 designates a magnetic substance, and 33 designates an interconnection pattern. The arrows shown indicate directions of current.

The plurality of Hall elements 31a to 31h are provided on a semiconductor substrate, and a circular magnetic substance 32 having a function of magnetic concentration (hereinafter will be referred to as "magnetic concentration plate") is provided on the Hall elements 31a to 31h. Specifically, a total of eight Hall elements are provided including four Hall elements 31a, 31b, 31c and 31d located in direction X-X and four Hall elements 31e, 31f, 31g and 31h located in direction Y-Y.

FIG. 9 is a view for illustrating the operating principle of the magnetic sensor core shown in FIG. 8. Reference numeral 30 designates an IC chip. A magnetic flux approaching to the sensor core in a horizontal direction (indicated by X or Y in FIG. 9) is deflected vertically and inputted to the Hall elements. Hall elements that are disposed symmetrically across the magnetic concentration plate 32 are subjected to magnetic fields oriented in opposite directions. The magnetic concentration plate 32 does not have the function of deflecting a magnetic flux approaching to the sensor core in a vertical direction (i.e., Z-direction). Therefore, Hall elements that are disposed symmetrically across the magnetic concentration plate 32 are subjected to magnetic fields oriented in the same direction. When differences among output voltages of the respective Hall elements are found by appropriate signal processing, magnetic fields oriented in the horizontal directions (i.e., directions X and Y) can be detected. At that time, magnetic field components in the vertical direction (Z) are cancelled since these components are oriented in the same direction. When the sum of the output voltages of the respective Hall elements is found, the magnetic fields oriented in the vertical direction (Z) can be detected, with the horizontal components cancelled. By thus switching between calculations for finding the sum of the outputs of the Hall elements and for finding the differences among the outputs of the Hall elements, it is possible to detect magnetic fields oriented in the directions X, Y and Z.

FIG. 10 is a circuit block diagram of an azimuth measuring device using the azimuth sensor shown in FIG. 8. In FIG. 10, reference numeral 41 designates a circuit unit, 42a designates a VDP terminal, 42b designates a VDN terminal, 42c designates an MCLK terminal, 42d designates a V150PRE terminal, 42e designates a VDD terminal, 42f designates a VSS terminal, 42g designates a V150B terminal, 42h designates an output terminal, 51a designates X-direction Hall elements (four elements) and driving switches connected directly thereto, 51b designates Y-direction Hall elements (four elements) and driving switches connected directly thereto, 52a, 52b, 52c and 52d designate channel selecting multiplexers for selecting which of the X-, Y- and Z-channels of four Hall elements is to be measured, 53 designates a reference voltage generating circuit for a DDA (Differential Difference Amplifier) as a preamplifier, 54 designates a clock generating circuit, 55a and 55b designate polarity reversing switches for Z-direction detection, 56 designates a DDA as a preamplifier, 57 designates a chopper switch (the operation thereof will be described later), 58 designates a monitor switch, 59 designates a reference voltage generating circuit for a buffer amplifier, and 60 designates the buffer amplifier.

Description will be made of the operation of this circuit including a measurement sequence shown in FIG. 12. The total of eight X-direction and Y-direction Hall elements shown in FIG. 8 are driven at a constant current value via the VDP terminal 42a and the VDN terminal 42b. Each of the Hall elements is driven with a current flowing in a direction indicated by an arrow in FIG. 8. The direction of current is changed by a clock signal generated based on SW and MCLK. This is done for the purpose of canceling the offset of each Hall element, the offset of the DDA 56 as a preamplifier, and flicker noise by a spinning current method which is well-known as a method of canceling an offset and flicker noise of a Hall element.

FIGS. 11(a) to 11(d) are each a diagram for illustrating an offset cancellation method used for the circuit of the azimuth measuring device shown in FIG. 10. The driving direction of a Hall element can be switched up to 360° by changing the driving direction of the Hall element and the polarity of the output of the DDA 56 by means of the chopper switch 57. When the outputs of respective phases are added up, the offsets of the DDA 56 and the Hall element are finally cancelled, so that a Hall voltage amplified by four times is outputted. Though various addition methods are conceivable, a method using an integrator and a method using a sample and hold circuit are suitable. Any one of Hall voltages in X-, Y- and Z-directions is inputted to the DDA 56 by the associated MUX (multiplexer) as a selector, and switching is made between the Hall voltages sequentially like X→Y→Z before inputting of the Hall voltages to the DDA 56. Each of the Hall voltages amplified by the DDA 56 is outputted as an analog voltage through the buffer amplifier 60.

FIG. 12 is a chart showing one example of a specific measurement sequence. A selected X-direction output voltage of a Hall element, which has been amplified by the DDA 56, is integrated by 10 ms by an integrator for noise reduction and amplification and then A/D converted. With sequential switching to Y and then to Z, a similar process is performed. At the time A/D conversion of the Z-direction output is finished, one-time measurement is completed. The interval from a one-time measurement to the subsequent measurement is 200 ms. This process is performed by another board connected to the circuit shown in FIG. 10. The present method enables a Hall element to detect weak magnetic signals, such as the earth magnetism, at a practical S/N ratio.

FIG. 13 is a chart showing a practical resistance value range of a Hall element when the azimuth sensor shown in FIG. 8 is used to realize the circuit block of the azimuth measuring device shown in FIG. 10. As shown in FIG. 3, a solid line circular mark and a broken line circular mark in FIG. 13 represent a cross-shaped Hall element and a square-shaped Hall element, respectively; and the upper right-hand circular mark represents the Hall element of the present invention, while the lower left-hand circular mark represents a normal Hall element. In FIG. 13, a region defined by broken lines is a range from 1 kΩ to 5.3 kΩ as a resistance value range which can be used for mobile devices.

This practical range is determined on the following grounds. The S/N ratio is an indicator of practicality of an azimuth measuring device. In applications to mobile devices, an S/N ratio of 30 is considered to be one standard. As is well known, a small consumption current of each part is a necessary condition for mobile devices.

For example, a Hall element having a low resistance value has a benefit of low thermal noise and a drawback of low sensitivity at the same time. The drawback of low sensitivity can be overcome by increasing the driving current of the Hall element, but the Hall element, when applied to a mobile device, has a drawback of increased consumption current. When a Hall element consumption current of not more than 5 mA is set as a standard practically, a resistance value at which an S/N ratio of not less than 30 is obtained is not less than 1 kΩ in the case of the Hall element disclosed by the present invention.

By contrast, a Hall element having a high resistance value has a drawback of high thermal noise and a benefit of high sensitivity. When this Hall element is driven at a driving current equal to that at which the Hall element having a low resistance value is driven, a higher S/N ratio is obtained than the Hall element having a low resistance value. However, circuit design limitations are actually imposed on the current driving the Hall element. Assuming that the two Hall elements are driven at equal current, the Hall element having a high resistance value causes a larger voltage drop (resistance value×driving current). In an actual circuit design, such a voltage drop is not permitted to exceed a predetermined voltage (for example source voltage). Therefore, the driving current of the Hall element having a high resistance value is likely to be limited. For example, Hall elements having respective resistance values of R and 2R have respective sensitivities of S and 2S theoretically. Taking the limitation on the voltage drop into consideration, driving currents of the respective Hall elements are 2I and I. Accordingly, Hall voltages that can be actually obtained are equal to each other.

In terms of thermal noise, because the thermal noise of the Hall element having a low resistance value is lower by a factor of $\sqrt{2}$, the Hall element having a low resistance value is more advantageous in terms of a final S/N ratio. Under the conditions that: the resistance of a Hall element has a certain upper limit; an S/N ratio of 30 is ensured; a source voltage is set to 3.0 V; and a voltage drop caused by the Hall element is set to 2.0 V in view of the source voltage thus set, which are established in view of the aforementioned limitations, the resistance value of the present example is 5.3 kΩ. According to FIG. 13, the cross-shaped normal Hall element has a resistance value of about 2.0 kΩ and an S/N ratio of about 9 per current, whereas the cross-shaped Hall element according to the present invention has a resistance value of about 4.30 kΩ and an S/N ratio of about 18 per current.

In FIG. 13, the Hall element disclosed by the present invention and the normal Hall element are plotted. Regardless of its shape, a Hall element having a low-concentration n-well is more advantageous in terms of S/N ratio per unit current. Taking this fact together with the effect shown in FIG. 6 into consideration, the cross-shaped Hall element achieves a greater effect and is suitable particularly for an azimuth measuring device for use in a mobile device.

INDUSTRIAL APPLICABILITY

It is possible to realize a Hall element which has a high sensitivity and contributes to an improvement in S/N ratio per current, as well as a Hall element having a high breakdown voltage and high reliability.

Since the magnetic sensing part is formed so as to be surrounded by the p-type substrate region, a Hall element having a high breakdown voltage and high reliability can be realized.

The invention claimed is:

1. A Hall element adapted to detect a magnetic field component perpendicular to a substrate surface including an n-type impurity region located in a surface of a p-type semiconductor substrate layer, said n-type impurity region functioning as a magnetic sensing part, characterized in that
a p-type impurity region is located in a surface of said n-type impurity region, and said n-type impurity region is surrounded by a p-type substrate region of said p-type semiconductor substrate layer, and
an impurity concentration N in surface of said n-type impurity region is $1\times10^{16}(\text{atoms/cm}^3) \leq N \leq 3\times10^{16}(\text{atoms/cm}^3)$, and a distribution depth D to a depth at which the impurity concentration in surface of said n-type impurity region does down to one-tenth from surface of said n-type impurity region is $3.0\ \mu m \leq D \leq 5.0\ \mu m$.

2. The Hall element according to claim 1, characterized in that said p-type substrate region has a resistivity equal to that of said p-type semiconductor substrate layer.

3. A magnetic sensor characterized in that a plurality of Hall elements according to claim 2 are provided on a semiconductor substrate; and a magnetic substance having a function of magnetic concentration is provided on the Hall elements.

4. An azimuth measuring device characterized in that the magnetic sensor according to claim 3 is used therein.

5. A magnetic sensor characterized in that a plurality of Hall elements according to claim 1 are provided on a semiconductor substrate; and a magnetic substance having a function of magnetic concentration is provided on the Hall elements.

6. An azimuth measuring device characterized in that the magnetic sensor according to claim 5 is used therein.

* * * * *